United States Patent
Yano

(10) Patent No.: US 11,348,903 B2
(45) Date of Patent: May 31, 2022

(54) SEMICONDUCTOR MODULE AND POWER CONVERSION DEVICE

(71) Applicant: Mitsubishi Electric Corporation, Tokyo (JP)

(72) Inventor: Shinya Yano, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/040,983

(22) PCT Filed: May 30, 2018

(86) PCT No.: PCT/JP2018/020825
§ 371 (c)(1),
(2) Date: Sep. 24, 2020

(87) PCT Pub. No.: WO2019/229894
PCT Pub. Date: Dec. 5, 2019

(65) Prior Publication Data
US 2021/0098428 A1 Apr. 1, 2021

(51) Int. Cl.
*H01L 25/07* (2006.01)
*H01L 23/373* (2006.01)
(Continued)

(52) U.S. Cl.
CPC ........ *H01L 25/072* (2013.01); *H01L 23/3735* (2013.01); *H01L 23/492* (2013.01); *H01L 23/49537* (2013.01); *H01L 23/49541* (2013.01); *H01L 23/49811* (2013.01); *H01L 25/18* (2013.01); *H01L 2224/40137* (2013.01)

(58) Field of Classification Search
CPC . H01L 23/3735; H01L 23/492; H01L 23/495; H01L 23/49537; H01L 23/49541;
(Continued)

(56) References Cited

U.S. PATENT DOCUMENTS 7,542,317 B2 * 6/2009 Azuma ................ H01L 25/072
363/131
2010/0044885 A1 2/2010 Fuergut et al.
(Continued)

FOREIGN PATENT DOCUMENTS

CN 102254886 A 11/2011
DE 10 2009 038 702 A1 4/2010
(Continued)

OTHER PUBLICATIONS

Machine translation of JP 2015018943 A (Year: 2015).*
(Continued)

*Primary Examiner* — Andres Munoz
(74) *Attorney, Agent, or Firm* — Xsensus LLP

(57) ABSTRACT

A semiconductor module includes: an upper arm module including a semiconductor chip; and a lower arm module including a semiconductor chip. The lower arm module is provided with: a facing section in which a lead frame and a lead frame each having a strip shape are disposed such that a main surface of the lead frame and a main surface of the lead frame face each other; and a non-facing section in which the lead frame and the lead frame are disposed such that the main surface of the lead frame and the main surface of the lead frame do not face each other.

14 Claims, 9 Drawing Sheets

(51) Int. Cl.
*H01L 23/495* (2006.01)
*H01L 23/492* (2006.01)
*H01L 23/498* (2006.01)
*H01L 25/18* (2006.01)

(58) Field of Classification Search
CPC ......... H01L 23/49575; H01L 23/49811; H01L 25/072; H01L 25/18; H01L 2224/40137; H02P 27/08
See application file for complete search history.

(56) References Cited

U.S. PATENT DOCUMENTS

| | | |
|---|---|---|
| 2013/0285221 A1 | 10/2013 | Miyasaka |
| 2015/0270786 A1 | 9/2015 | Chen et al. |
| 2019/0206751 A1 | 7/2019 | Harada et al. |

FOREIGN PATENT DOCUMENTS

| | | | |
|---|---|---|---|
| JP | 2000-060148 A | | 2/2000 |
| JP | 2000060148 A | * | 2/2000 |
| JP | 2011-167010 A | | 8/2011 |
| JP | 2015-018943 A | | 1/2015 |
| WO | 2012/093521 A1 | | 7/2012 |
| WO | 2014/122877 A1 | | 8/2014 |
| WO | 2018/056287 A1 | | 3/2018 |

OTHER PUBLICATIONS

International Search Report and Written Opinion dated Aug. 7, 2018 for PCT/JP2018/020825 filed on May 30, 2018, 10 pages including English Translation of the International Search Report.
Notification of Reasons for Refusal received for Japanese Patent Application No. 2018-560931, mailed on Jan. 29, 2019, 8 pages including English Translation.

* cited by examiner

SEMICONDUCTOR MODULE AND POWER CONVERSION DEVICE

CROSS-REFERENCE TO RELATED APPLICATION

The present application is based on PCT filing PCT/JP2018/020825, filed May 30, 2018, the entire contents of which are incorporated herein by reference.

TECHNICAL FIELD

The present invention relates to a semiconductor module and a power conversion device, and particularly to a semiconductor module having a direct lead bonding structure and a power conversion device to which the semiconductor module is applied.

BACKGROUND ART

In recent years, from the viewpoints of long-term reliability and loss reduction for a semiconductor module, a demand for high speed driving has also been increasing. One of the solutions regarding both of these viewpoints is a direct lead bonding (DLB) structure in which a lead frame is directly joined to a semiconductor chip with a joining material such as solder.

As compared with a wire-bonding structure, the DLB structure generally allows a longer lifetime and also allows easy reduction of the parasitic inductance that hinders high speed driving, but increases design restrictions as compared with a wire-bonding structure. For example, semiconductor chips connected in parallel cause a problem that a current between the semiconductor chips connected in parallel is more likely to deviate due to influences such as different parasitic inductances in a current loop for each semiconductor chip.

PTL 1 proposes a semiconductor module for solving the above-mentioned problem. In the semiconductor module proposed in PTL 1, wiring conductors are disposed to entirely face each other to reduce the parasitic inductance and also equalize the parasitic inductance in a current loop between the semiconductor chips electrically connected in parallel, thereby equalizing the current between the semiconductor chips.

CITATION LIST

Patent Literature

PTL 1: Japanese Patent Laying-Open No. 2015-018943

SUMMARY OF INVENTION

Technical Problem

According to the conventional method, two semiconductor chips electrically connected in parallel can achieve an effect of equalizing the current between the semiconductor chips. However, three or more semiconductor chips electrically connected in parallel in the same direction may produce a portion exhibiting a too large mutual inductance or, on the contrary, may produce a portion exhibiting a too small mutual inductance. This may make it difficult to equalize the current between the semiconductor chips, which may prevent elimination of the current deviation between the semiconductor chips electrically connected in parallel.

The present invention has been made to solve the above-described problems. One object of the present invention is to provide a semiconductor module that allows elimination of current deviation between semiconductor chips. Another object of the present invention is to provide a power conversion device to which the semiconductor module is applied.

Solution to Problem

A semiconductor module according to the present invention includes a base member, a plurality of semiconductor chips, a first wiring conductor, and a second wiring conductor. The base member has a main surface and includes at least one of a conductor and an insulator. The semiconductor chips are mounted on the main surface of the base member. The first wiring conductor is electrically connected to each of the semiconductor chips in a state where the semiconductor chips are electrically connected in parallel. The second wiring conductor is electrically connected to the first wiring conductor. The first wiring conductor and the second wiring conductor include: a facing section in which the first wiring conductor and the second wiring conductor are disposed to face each other; and a non-facing section in which the first wiring conductor and the second wiring conductor are disposed not to face each other.

A power conversion device according to the present invention includes: a main conversion circuit to convert received electric power and output converted electric power, wherein the main conversion circuit includes the semiconductor module; and a control circuit to output a control signal for controlling the main conversion circuit to the main conversion circuit.

Advantageous Effects of Invention

According to the semiconductor module of the present invention, the first wiring conductor and the second wiring conductor include the facing section and the non-facing section to thereby allow equalization of the current flowing through each of the plurality of semiconductor chips.

According to the power conversion device of the present invention, the semiconductor module is provided to thereby allow equalization of the current flowing through each of the plurality of semiconductor chips.

DESCRIPTION OF EMBODIMENTS

Figure 1:
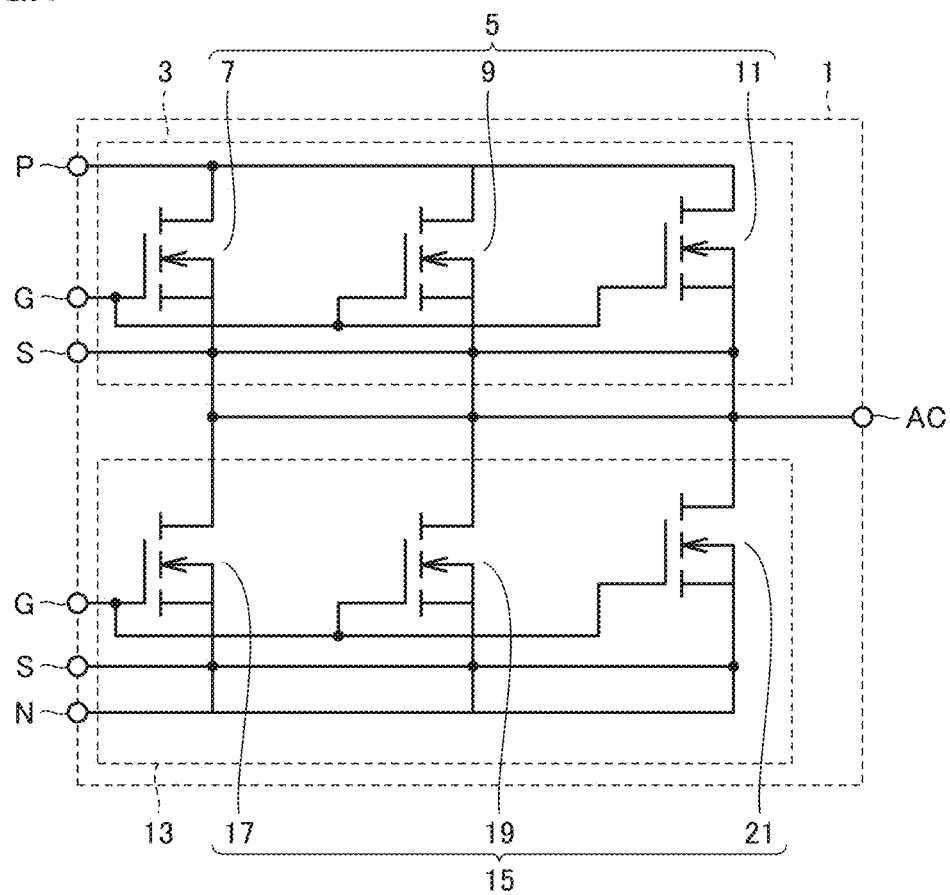
FIG. 1 is a circuit diagram of a semiconductor module according to each of embodiments of the present invention.

First, a circuit diagram of a semiconductor module according to each of embodiments will be described. FIG. 1 shows a circuit diagram of a semiconductor module 1. As shown in FIG. 1, semiconductor module 1 corresponds to one of phases of a three-phase inverter. Three semiconductor modules 1 are electrically connected in parallel to drive a three-phase motor (not shown). Furthermore, semiconductor module 1 can also be used as a single-phase inverter or a single-phase converter.

Semiconductor module 1 has a terminal P, a terminal N, and an external terminal AC. Terminal P is electrically connected to an anode of a power supply or an anode of a smoothing capacitor. Terminal N is electrically connected to a cathode of the power supply or a cathode of the smoothing capacitor. External terminal AC is electrically connected to a motor and the like.

Semiconductor chips 7, 9, and 11 electrically connected in parallel between terminal P and external terminal AC are referred to as an upper arm element 5. Semiconductor chips 7, 9, and 11 constitute an upper arm module 3 as a part of semiconductor module 1.

Semiconductor chips 17, 19, and 21 electrically connected in parallel between external terminal AC and terminal N are referred to as a lower arm element 15. Semiconductor chips 17, 19, and 21 constitute a lower arm module 13 as the other part of semiconductor module 1.

In each of upper arm element 5 and lower arm element 15 in semiconductor module 1, three metal oxide semiconductor field effect transistors (MOSFET) are electrically connected in parallel. In the circuit diagram of semiconductor module 1 shown in FIG. 1, only a MOSFET is applied as each of upper arm element 5 and lower arm element 15, but a MOSFET may be electrically connected in anti-parallel with a freewheeling diode.

Also, in place of a MOSFET, an insulated gate bipolar transistor (IGBT) may be electrically connected in anti-parallel with a freewheeling diode. Furthermore, in each of upper arm element 5 and lower arm element 15, three semiconductor chips are electrically connected in parallel, but four or more semiconductor chips may be electrically connected in parallel.

As shown in FIG. 1, the MOSFET of each of the upper arm element and the lower arm element has a gate electrode G and a source electrode S as controlling electrodes. In addition to gate electrode G and source electrode S, the controlling electrode of the MOSFET may include, for example, an electrode connected to a temperature-sensing diode for detecting the temperature of each semiconductor chip or may also include an electrode connected to a current-detecting diode for detecting the current flowing through each semiconductor chip. In the following, the structure of semiconductor module 1 will be specifically described. Each of the embodiments will be described with reference to X-Y-Z coordinate axes for convenience of description.

First Embodiment

The first example of lower arm module 13 as a part of semiconductor module 1 will be hereinafter described.

Figure 2:
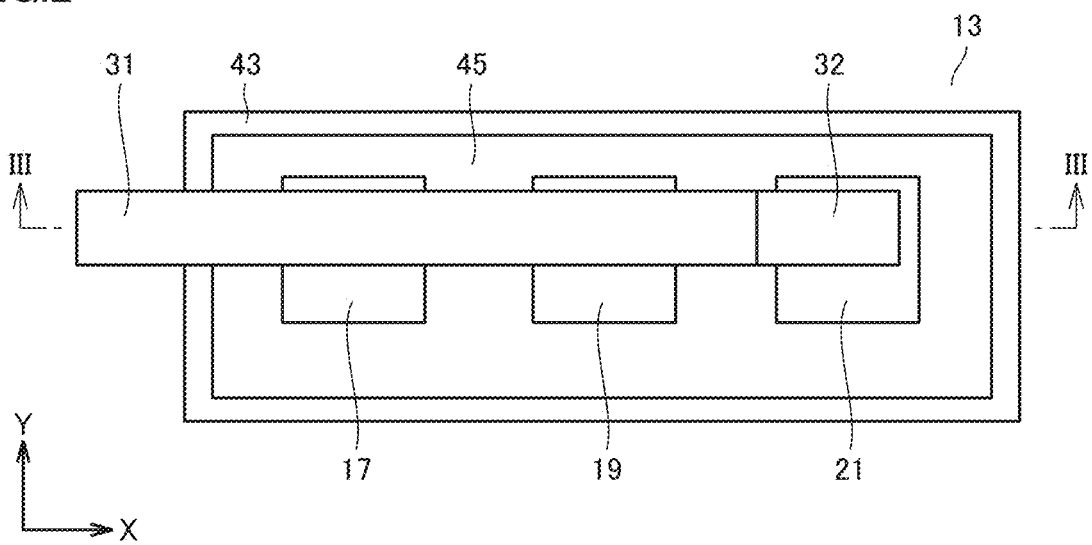
FIG. 2 is a partial top view of the semiconductor module according to the first embodiment of the present invention.
Figure 3:
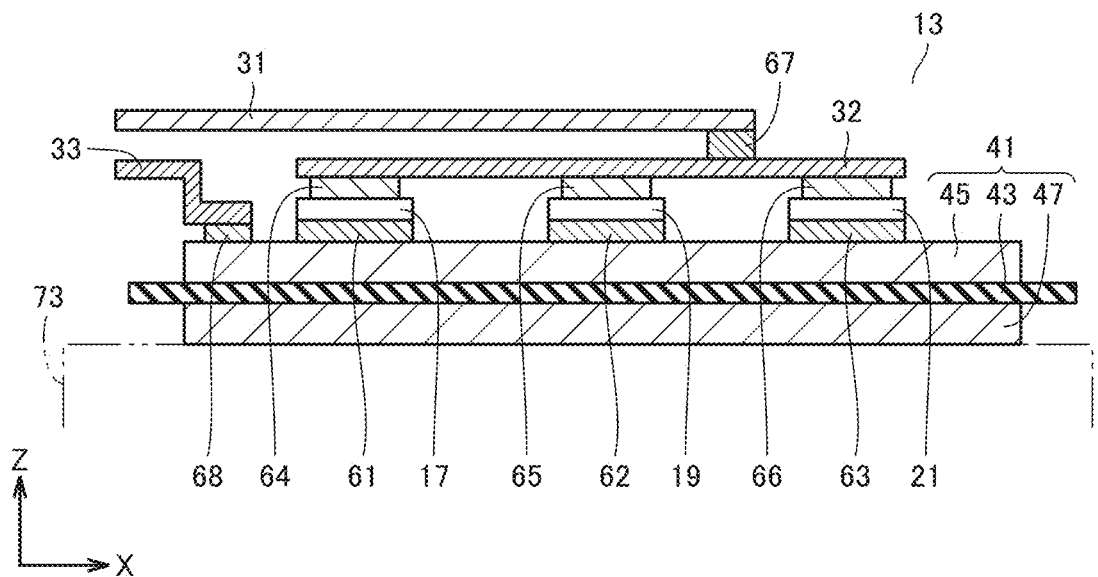
FIG. 3 is a partial cross-sectional view taken along a cross-sectional line shown in FIG. 2 in the first embodiment.

As shown in FIGS. 2 and 3, lower arm module 13 includes semiconductor chips 17, 19, and 21. Semiconductor chips 17, 19, and 21 are mounted on a substrate 41 serving as a base member. Substrate 41 includes an insulator 43, a conductor 45, and a conductor 47, for example. Conductor 45 is joined to one surface of insulator 43. Conductor 47 is joined to the other surface of insulator 43.

Semiconductor chip 17 is connected electrically and thermally to conductor 45 with an electrically conductive joining material 61. Semiconductor chip 19 is connected electrically and thermally to conductor 45 with an electrically conductive joining material 62. Semiconductor chip 21 is connected electrically and thermally to conductor 45 with an electrically conductive joining material 63.

Each of conductors 45 and 47 is formed of metal such as copper and aluminum, for example. The material applied to insulator 43 is an insulating sheet or the like that is formed of ceramic such as silicon nitride and aluminum nitride, a resin or the like, for example. Conductor 47 is used desirably from the viewpoints of long-term reliability and heat dissipation performance, but not necessarily required. The material applied to joining materials 61, 62, and 63 is solder, silver, copper, or the like, for example.

A lead frame 33 is electrically connected to conductor 45 with a joining material 68. Lead frame 33 is electrically connected to external terminal AC (see FIG. 1). Lead frame 33 is formed of metal such as copper, for example. The material applied to joining material 68 is solder, silver, copper, or the like, for example. Lead frame 33 may be directly joined to conductor 45 with ultrasonic waves or laser in place of joining material 68. Furthermore, a wire, a ribbon or the like made of metal may be used in place of lead frame 33.

A lead frame 32 is electrically connected to the upper surface of semiconductor chip 17 with a joining material 64. Lead frame 32 is electrically connected to the upper surface of semiconductor chip 19 with a joining material 65. Lead frame 32 is electrically connected to the upper surface of semiconductor chip 21 with a joining material 66. Lead frame 32 is used as the first wiring conductor. The material applied to joining materials 64, 65, and 66 is solder, silver, copper, or the like, for example. Lead frame 32 is formed of metal such as copper, for example.

A lead frame 31 is electrically connected to lead frame 32 with a joining material 67. Lead frame 31 is connected to a portion of lead frame 32 that is located at a midpoint between semiconductor chips 19 and 21. Lead frame 31 is used as the second wiring conductor. The material applied to joining material 67 is solder, silver, copper, or the like, for example. Lead frame 31 is formed of metal such as copper, for example. Each of lead frames 31 and 32 has a width and extends in a strip shape. A ribbon or the like made of metal may be used in place of lead frames 31 and 32.

Each of three MOSFETs (semiconductor chips 17, 19, and 21) is provided with a controlling electrode (not shown). The controlling electrode is electrically connected to a controlling terminal with a wire made of metal such as aluminum, copper or gold. The controlling terminal is electrically connected to an external controlling substrate (not shown) or the like.

The controlling substrate has a function of outputting a signal to turn on and off each of the MOSFETs as semiconductor chips 17, 19, and 21. Furthermore, the controlling substrate has a function of sensing an overvoltage or an excessive rise in chip temperature. The controlling substrate may be provided inside semiconductor module 1 or may be provided outside semiconductor module 1.

Conductor 47 is connected to a heat sink 73 for heat dissipation. When conductor 47 is connected, joining materials such as grease, an insulating sheet and solder (each of which is not shown) or metal may be interposed between conductor 47 and heat sink 73. Also, a fin may be directly formed on conductor 47.

In semiconductor module 1, semiconductor chips 17, 19, 21 and the like are sealed by a sealing material 71 (see FIG. 6) for the purpose of ensuring the insulation performance and the like. As sealing material 71, for example, gel, an epoxy resin and the like are used. Furthermore, a case (not shown) used for hardening sealing material 71 may be provided as required.

Figure 4:
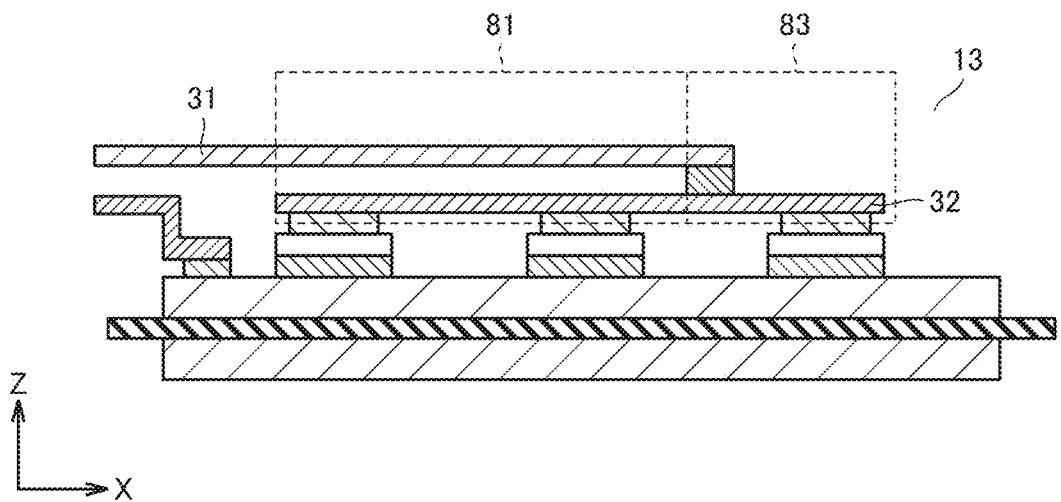
FIG. 4 is a partial cross-sectional view showing a facing section and a non-facing section in the semiconductor module in the first embodiment.

As shown in FIG. 2, in lower arm module 13, semiconductor chips 17, 19, and 21 are disposed at a distance from one another to extend along an X-axis. Lead frames 31 and 32 each having a strip shape are disposed to extend in an X-axis direction in accordance with the arrangement of semiconductor chips 17, 19, and 21. As shown in FIG. 4, lower arm module 13 includes a facing section 81 in which lead frames 31 and 32 each having a strip shape are disposed such that the main surface of lead frame 31 faces the main surface of lead frame 32.

On the other hand, there is a region where lead frame 32 does not face lead frame 31, which ranges from a portion of lead frame 31 at which lead frame 31 is joined to lead from 32 to the end portion of lead frame 32. This region corresponds to a non-facing section 83 in which the main surface of lead frame 31 does not face the main surface of lead frame 32. The area of facing section 81 in which the main surface of lead frame 31 faces the main surface of lead frame 32 is larger than the area of non-facing section 83 in which the main surface of lead frame 31 does not face the main surface of lead frame 32.

In facing section 81, when semiconductor chips 17, 19, and 21 are turned on, a current flows through lead frame 32 in the X-axis positive direction while a current flows through lead frame 31 in the X-axis negative direction. In other words, in facing section 81, the direction of the current flowing through lead frame 31 is opposite to the direction of the current flowing through lead frame 32.

Thus, the magnetic field generated by the current flowing through lead frame 31 and the magnetic field generated by the current flowing through lead frame 32 are to cancel out each other. Both the magnetic fields cancel out each other, to thereby allow reduction of the parasitic inductance included in semiconductor module 1.

Figure 5:
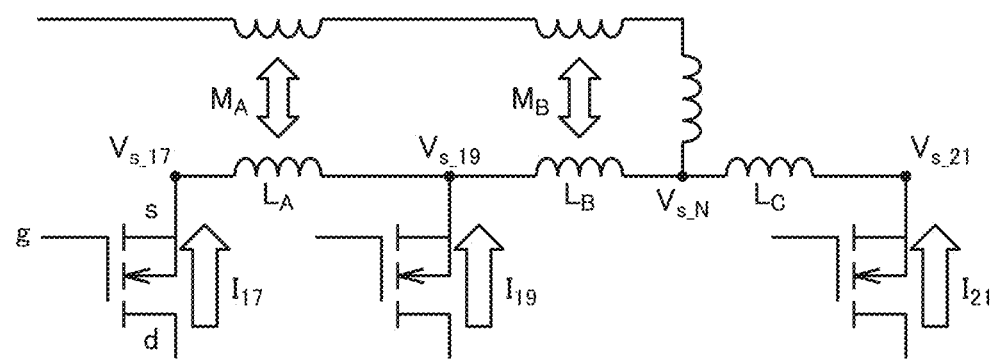
FIG. 5 shows an outline of an equivalent circuit of the semiconductor module in the first embodiment.

The parasitic inductance will be hereinafter described. FIG. 5 shows a circuit diagram corresponding to the relation of arrangement of semiconductor chips 7, 9, 11, lead frames 31, 32 and the like in lower arm module 13 shown in FIG. 3, additionally including main parasitic inductances.

As shown in FIGS. 3 and 5, lead frame 32 includes a self-inductance $L_A$ resulting from a portion (a portion A) of lead frame 32 that is located between the source side of semiconductor chip 17 and the source side of semiconductor chip 19. Also, lead frame 32 includes a self-inductance $L_B$ resulting from a portion (a portion B) of lead frame 32 that is located between the source side of semiconductor chip 19 and a portion of lead frame 32 to which lead frame 31 is joined with joining material 67. Furthermore, a self-inductance $L_C$ exists that results from a portion of lead frame 32 that is located between a portion of lead frame 32 to which lead frame 31 is joined with joining material 67 and the source side of semiconductor chip 21.

Furthermore, a voltage is induced in lead frame 32 due to the current flowing through lead frame 31. In this case, the component of the mutual inductance related to portion A of lead frame 32 and a portion of lead frame 31 that corresponds to portion A is defined as a mutual inductance $M_A$. The component of the mutual inductance related to portion B of lead frame 32 and a portion of lead frame 31 that corresponds to portion B is defined as a mutual inductance $M_B$. In addition, a mutual inductance and the like caused by the current flowing through conductor 45 also exist, but they are less influential and therefore ignored in this case.

The current flowing through each of semiconductor chips 17, 19, and 21 is significantly influenced by the magnitude of the voltage between the gate and the source at the time when each of semiconductor chips 17, 19, and 21 is turned on. The gates of semiconductor chips 17, 19, and 21 are electrically connected in parallel while the sources thereof are also electrically connected in parallel. However, on the source side, the inductance in the circuit of lower arm module 13 may cause different induced voltages when the current changes. Since the difference between the induced voltages thus generated may cause unevenness in the current, lower arm module 13 (semiconductor module 1) desirably has a structure that allows uniform source potentials in semiconductor chips 17, 19, and 21.

In this case, the voltage in the portion at which lead frame 31 is joined to lead frame 32 is defined as a reference voltage $V_{s\_N}$. The current flowing through semiconductor chip 17 is defined as $I_{17}$, the current flowing through semiconductor chip 19 is defined as $I_{19}$, and the current flowing through semiconductor chip 21 is defined as $I_{21}$. Also, the voltage on the source side of semiconductor chip 17 is defined as $V_{s\_17}$, the voltage on the source side of semiconductor chip 19 is defined as $V_{s\_19}$, and the voltage on the source side of semiconductor chip 21 is defined as $V_{s\_21}$.

Thus, the voltages on the respective source sides of semiconductor chips 17, 19, and 21 are represented by the following equations (1), (2), and (3), respectively.

$$V_{s\_21} - V_{s\_N} = L_C \cdot d(I_{21})/dt \tag{1}$$

$$V_{s\_19} - V_{s\_N} = L_B \cdot d(I_{17}+I_{19})/dt - M_B \cdot d(I_{17}+I_{19}+I_{21})/dt \tag{2}$$

$$V_{s\_17} - V_{s\_N} = L_A \cdot d(I_{17})dt + L_B \cdot d(I_{17}+I_{19})dt - (M_A+M_B) \cdot d(I_{17}+I_{19}+I_{21})/dt \tag{3}$$

It is assumed that the impedance in the wire in a control system is the same in semiconductor chips 17, 19, and 21, and semiconductor chips 17, 19, and 21 have the same characteristics. In this case, assuming that a current that flows uniformly is defined as I, the following equations (4) and (5) are satisfied.

$$I_{17}=I_{19}=I_{21}=I \quad (4)$$

$$V_{s\_17}=V_{s\_19}=V_{s\_21} \quad (5)$$

Based on the equations (1) to (5), the relations of the following equations (6) and (7) are obtained.

$$L_A=3M_A \quad (6)$$

$$L_C=2L_B-3M_B \quad (7)$$

When the distance between lead frames 31 and 32 is adjusted so as to satisfy the equation (6), the following equation (8) is also satisfied based on the structure of lower arm module 13.

$$L_B=3M_B \quad (8)$$

When the equation (8) is substituted into the equation (7), the relation of the following equation (9) is obtained.

$$L_C=2L_B-3M_B=L_B \quad (9)$$

On the above-mentioned ideal condition, the distance between the lead frames is first set so as to satisfy the equation (6). Furthermore, lead frame 31 is joined to lead frame 32 with joining material 67 at a midpoint between semiconductor chips 19 and 21 so as to satisfy the equation (9). By disposing lead frames 31 and 32 in this way, the currents flowing through semiconductor chips 17, 19, and 21 can be completely equalized.

However, in fact, the optimum position of the joining portion at which lead frame 31 is joined to lead frame 32 may deviate from the midpoint due to the difference between the impedances on the control wires, the variations in characteristics of the semiconductor chips, or the like. However, no use state generally occurs on the condition that the joining portion needs to be moved to the end portion on which semiconductor chip 21 is disposed or the end portion on which semiconductor chip 17 is disposed.

Thus, also in the case where there are variations in characteristics and the like of semiconductor chips 17, 19, and 21, non-facing section 83 in which lead frame 31 does not face a part of lead frame 32 is provided, with the result that this non-facing section 83 serves as an adjustment margin for the variations in characteristics and the like of semiconductor chips 17, 19, and 21, thereby allowing equalization of the currents flowing through semiconductor chips 17, 19, and 21. For example, in the case where $L_A>3M_A$ and $L_B>3M_B$ for manufacturing reasons, the position at which joining material 67 is joined is moved in the X-axis negative direction so as to increase $L_C$, thereby allowing adjustment for achieving uniform parasitic inductance.

In this way, lower arm module 13 (semiconductor module 1) is provided with facing section 81 and non-facing section 83 as an arranging structure of lead frames 31 and 32, and thereby, the variations in currents in semiconductor chips 17, 19, and 21 electrically connected in parallel can be suppressed while adopting a DLB structure that is excellent in long-term reliability and in terms of the parasitic inductance. Upper arm module 3 is also provided with semiconductor chips 7, 9, and 11 (see FIG. 1) and lead frames (not shown), as in lower arm module 13.

Semiconductor module 1 has been described above with regard to the case where lead frames 31 and 32 are joined to each other with joining material 67, but a lead frame formed of two lead frames integrated with each other may be used for connection.

Figure 6:
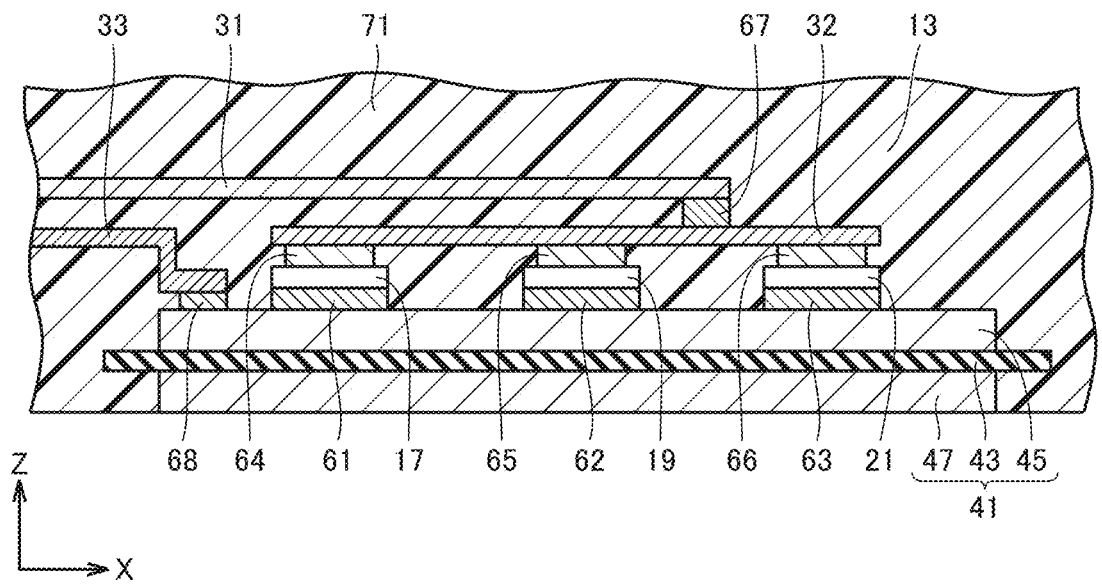
FIG. 6 is a partial cross-sectional view showing the semiconductor module sealed by a sealing material in the first embodiment.

Also as shown in FIG. 6, in the above-mentioned semiconductor module 1, sealing material 71 as an insulation material provides sealing, and this sealing material 71 exists between lead frames 31 and 32. Thus, even in the case where lead frame 31 is located close to lead frame 32, the electrical insulation performance can be ensured.

Thereby, when the current flowing through lead frame 31 and the current flowing through lead frame 32 flow in opposite directions, the effect of cancelling out the magnetic field is increased, so that the parasitic inductance can be reduced. In addition, an insulation material made of a material different from sealing material 71 may be provided between lead frames 31 and 32.

As shown in FIGS. 2 and 3, lead frames 31 and 32 are disposed to face each other above conductor 45. Thereby, lower arm module 13 can be reduced in size while conductor 45 can be reduced in length, with the result that the parasitic inductance can be reduced. In other words, facing section 81 is disposed on the side opposite to substrate 41 with respect to semiconductor chips 17, 19, and 21, so that the parasitic inductance can be reduced.

Figure 7:
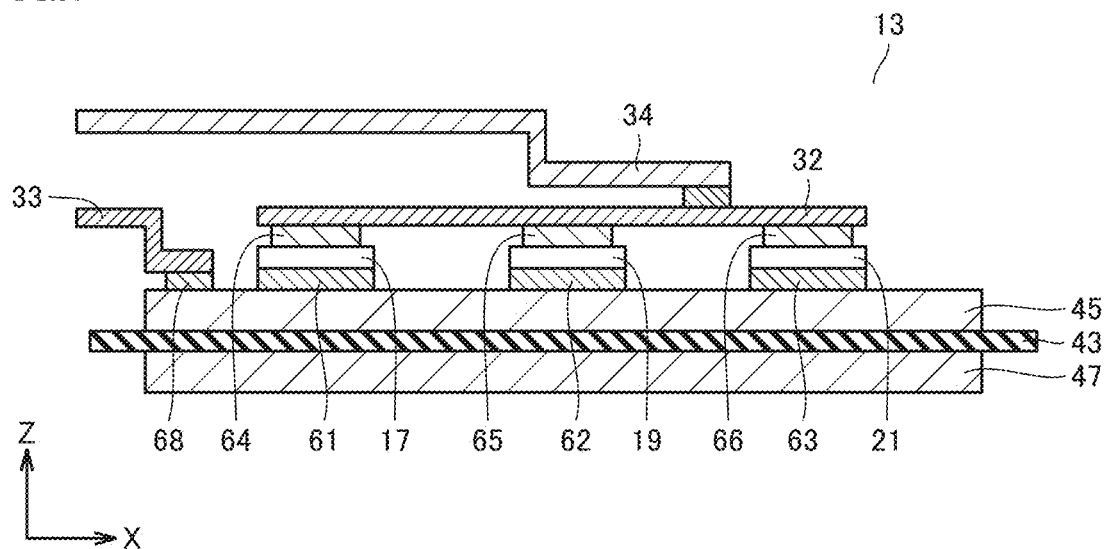
FIG. 7 is a partial cross-sectional view of a semiconductor module according to a modification in the first embodiment.
Figure 8:
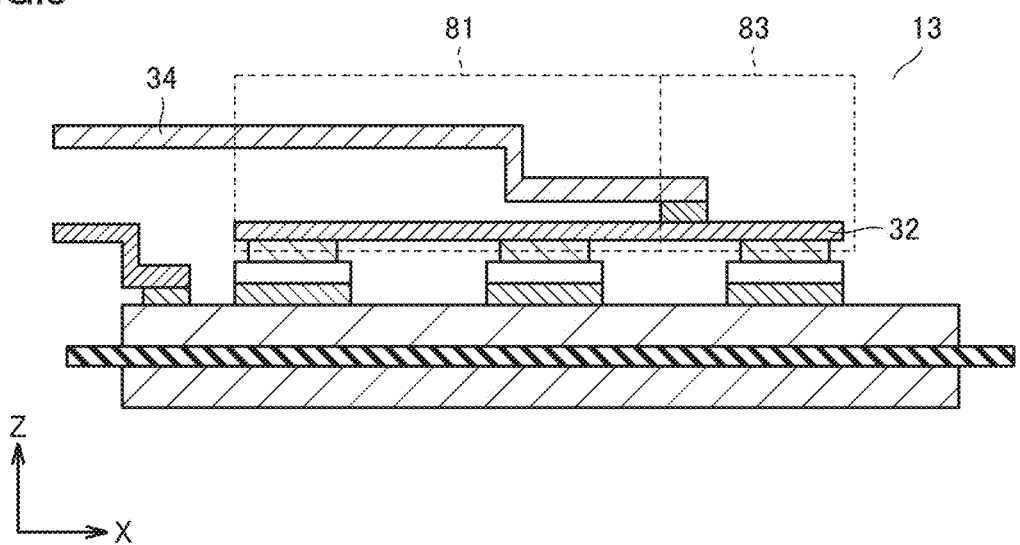
FIG. 8 is a partial cross-sectional view showing a facing section and a non-facing section in the semiconductor module according to the modification in the first embodiment.

Furthermore, as shown in FIGS. 7 and 8, lead frame 34 may be applied in place of lead frame 31. Lead frame 34 is provided with a bent portion in contrast to the shape of lead frame 31. By providing a bent portion in lead frame 34, two different distances are set in facing section 81 as a distance between lead frames 34 and 32 above semiconductor chips 17, 19, and 21.

Thereby, mutual inductances $M_A$ and $M_B$ between lead frames 34 and 32 can be separately adjusted, thereby allowing more detailed adjustment of the self-inductance. In addition to adjustment of the distance between lead frame 32 and lead frame 34 that has a bent portion, the widths of lead frames 31 and 32 may be adjusted for adjusting self-inductances $L_A$, $L_B$, and $L_C$ (see FIG. 5).

Furthermore, semiconductor module 1 (lower arm module 13) has been described above with reference to an example in which semiconductor chips 17, 19, and 21 are disposed in one row in one direction (in the X-axis direction). The semiconductor chips may be arranged not only in one row but also in a plurality of rows as long as three or more semiconductor chips are arranged in one direction.

Examples of the semiconductor chip include a semiconductor chip to which a wide band gap semiconductor having a large band gap as compared with the case of silicon (Si) is applied. A semiconductor module to which a wide band gap semiconductor is applied is often used in the state where a large number of small-sized semiconductor chips are electrically connected in parallel for manufacturing reasons, or often used at a higher switching speed for reducing the power loss in the semiconductor module.

Accordingly, the value of dI/dt shown in each of the equations (1), (2) and (3) is increased. Thus, as compared with a semiconductor chip of silicon (Si), the configuration of the conventional semiconductor module tends to cause variations in the current flowing through each semiconductor chip, thereby leading to an uneven current. Therefore, the above-mentioned semiconductor module 1 is more effective in the case where a semiconductor chip to which a wide band gap semiconductor is applied is mounted thereon.

Second Embodiment

The second example of the lower arm module as a part of the semiconductor module will be hereinafter described.

Figure 9:
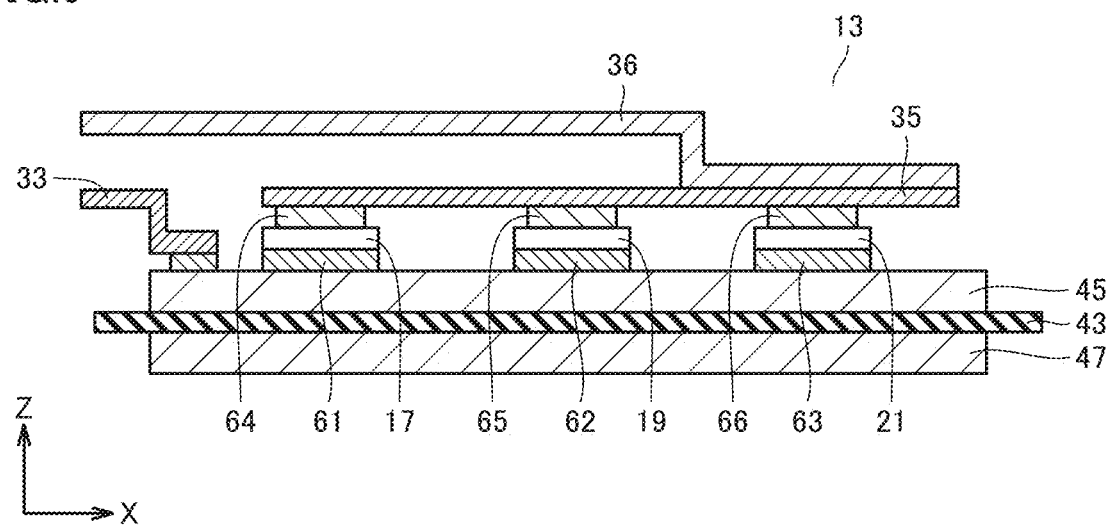
FIG. 9 is a partial cross-sectional view of a semiconductor module according to the second embodiment of the present invention.
Figure 10:
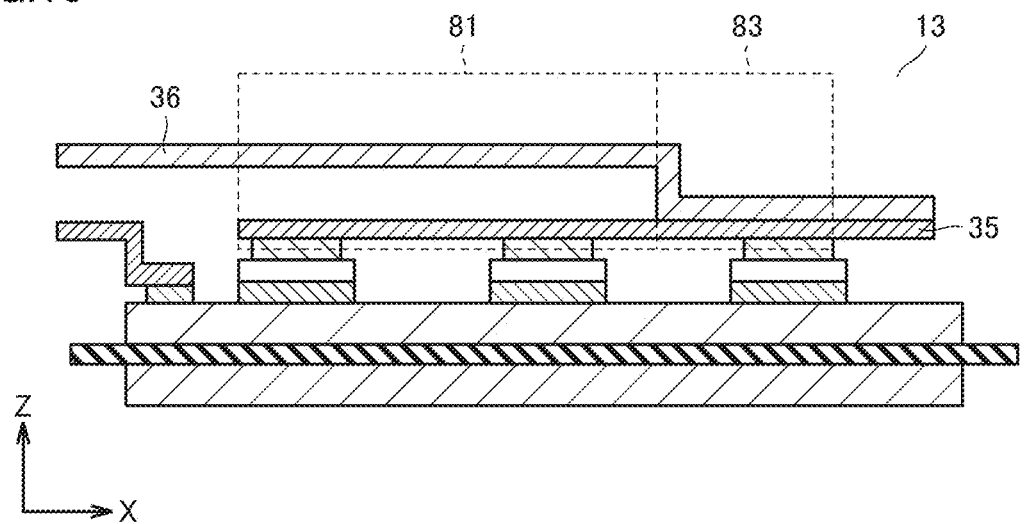
FIG. 10 is a partial cross-sectional view showing a facing section and a non-facing section in the semiconductor module in the second embodiment.

As shown in FIGS. 9 and 10, lower arm module 13 is provided with lead frames 35 and 36. Lead frame 35 is electrically connected to each of semiconductor chips 17, 19, and 21. Lead frame 36 extends to an end portion of lead frame 35 on the semiconductor chip 21 side. Lead frame 36 is joined to lead frame 35 in a range from a portion of lead frame 35 that is located at a midpoint between semiconductor chips 19 and 21 to the end portion of lead frame 35.

Facing section 81 is provided as a portion in which lead frames 35 and 36 face each other at a distance from each other. Non-facing section 83 is provided as a portion in which lead frame 36 is joined to lead frame 35 in a range in which lead frame 35 is joined to semiconductor chip 21 with joining material 66, the range extending from a portion of lead frame 35 that is located at a midpoint between semiconductor chips 19 and 21. Since the configuration other than the above is the same as the configuration of semiconductor module 1 (lower arm module 13) shown in FIGS. 2 and 3, the same members will be denoted by the same reference characters, and the description thereof will not be repeated unless required.

Also for the above-mentioned semiconductor module 1, the voltages on the respective source sides of semiconductor chips 17, 19, and 21 can be obtained to derive the relational expression corresponding to the equation (6) and the relational expression corresponding to the equation (9), in the same way as in the aforementioned semiconductor module 1. By setting facing section 81 and non-facing section 83 based on these relational expressions, the currents flowing through semiconductor chips 17, 19, and 21 can be equalized.

Semiconductor module 1 has been described above with regard to the structure in which lead frame 36 is joined to lead frame 35 from a portion of lead frame 35 that is located at a midpoint between semiconductor chips 19 and 21 to an end portion of lead frame 35. This structure may be replaced with a bus bar integrated with a portion where lead frame 36 is joined to lead frame 35.

Figure 11:
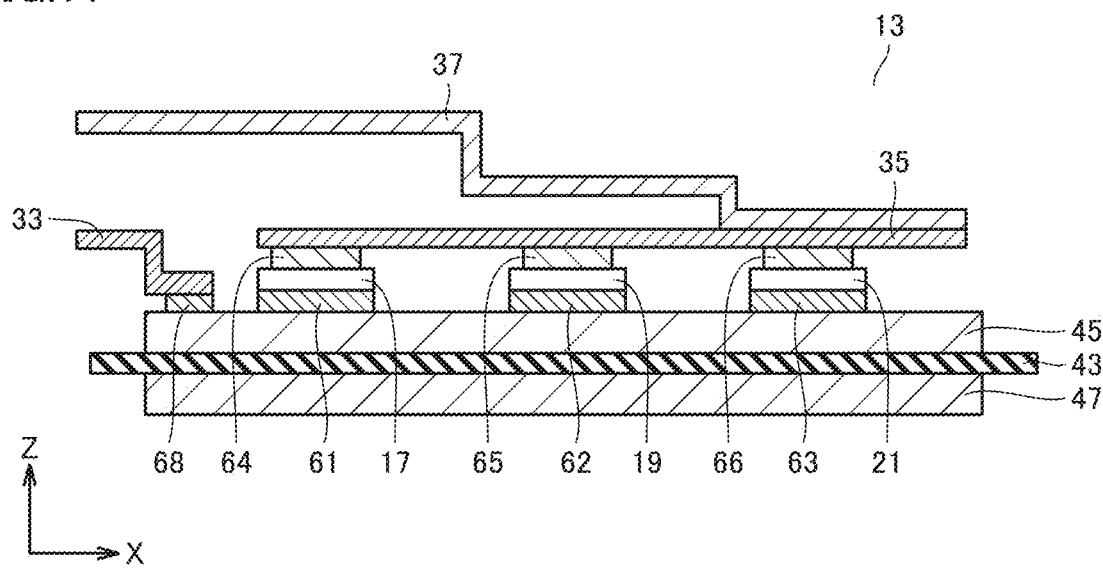
FIG. 11 is a partial cross-sectional view of a semiconductor module according to a modification in the second embodiment.
Figure 12:
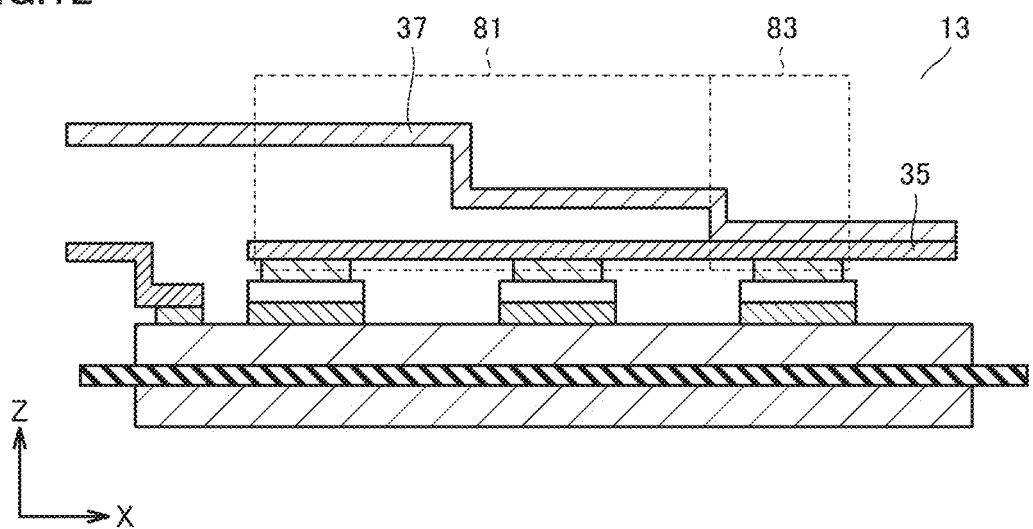
FIG. 12 is a partial cross-sectional view showing a facing section and a non-facing section in the semiconductor module according to the modification in the second embodiment.

Furthermore, as shown in FIGS. 11 and 12, a lead frame 37 may be applied in place of lead frame 36. By providing a bent portion in lead frame 37, two different distances are set in facing section 81 as a distance between lead frames 37 and 35 above semiconductor chips 17, 19, and 21.

Thereby, mutual inductances $M_A$ and $M_B$ between lead frames 37 and 35 can be separately adjusted, thereby allowing more detailed adjustment of the self-inductance. In addition to the adjustment of the distance between lead frame 35 and lead frame 37 that has a bent portion, the widths of lead frames 37 and 35 may be adjusted for adjusting self-inductances $L_A$, $L_B$, and $L_C$ (see FIG. 5).

Furthermore, in the same manner as described in the first embodiment, the above-mentioned semiconductor module 1 is more effective in the case where a semiconductor chip to which a wide band gap semiconductor is applied is mounted thereon.

Third Embodiment

The third example of the lower arm module as a part of the semiconductor module will be hereinafter described.

Figure 13:
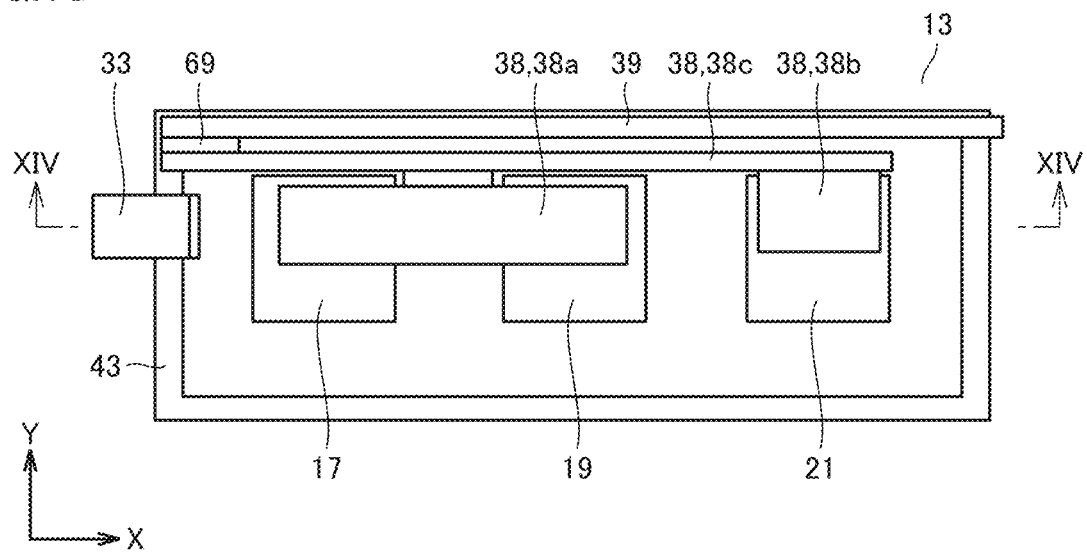
FIG. 13 is a partial top view of a semiconductor module according to the third embodiment of the present invention.
Figure 14:
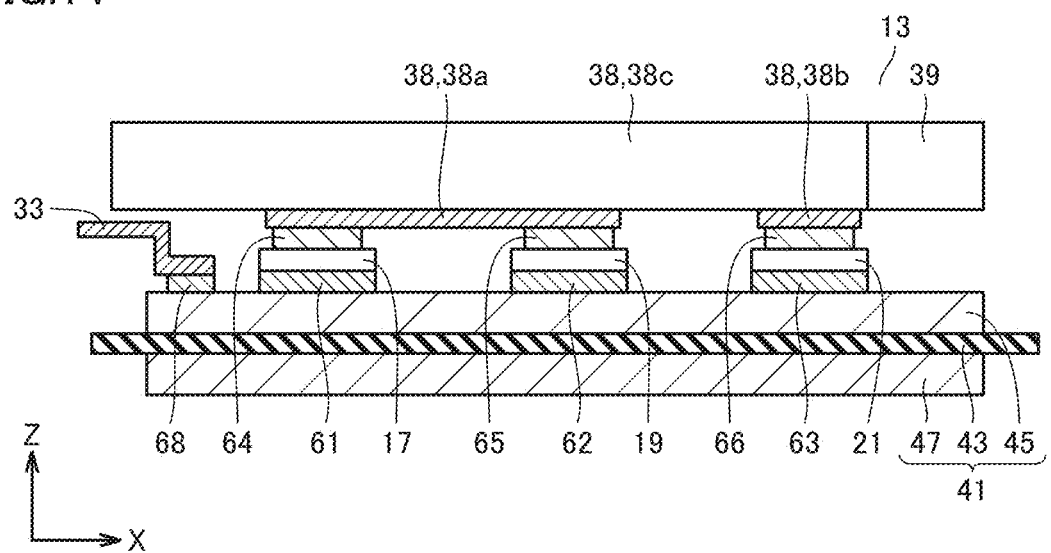
FIG. 14 is a partial cross-sectional view taken along a cross-sectional line XIV-XIV shown in FIG. 13 in the third embodiment.

As shown in FIGS. 13 and 14, lower arm module 13 is provided with lead frames 38 and 39. Lead frame 38 is formed of a first part 38a, a second part 38b, and a third part 38c. First part 38a has a width in the Y-axis direction and extends in the X-axis direction. Second part 38b also has a width in the Y-axis direction and extends in the X-axis direction.

Third part 38c has a width in the Z-axis direction and extends in the X-axis direction. Third part 38c is bent at about 90° with respect to first part 38a and second part 38b. Lead frame 39 has a width in the Z-axis direction and extends in the X-axis direction.

First part 38a is joined to semiconductor chip 17 with joining material 64 and joined to semiconductor chip 19 with joining material 65. Second part 38b is joined to semiconductor chip 21 with joining material 66. Third part 38c is joined to lead frame 39 with a joining material 69.

Figure 15:
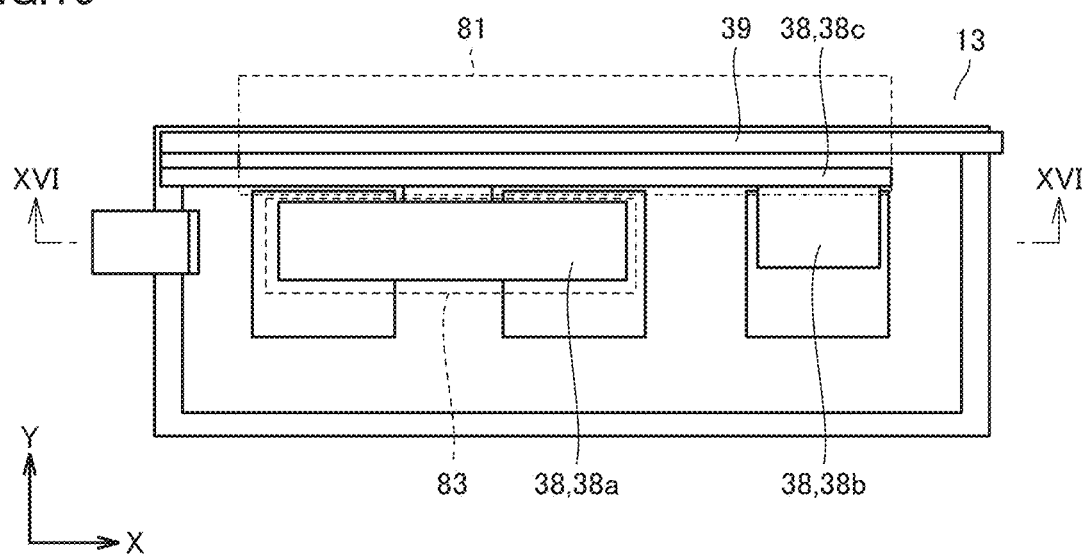
FIG. 15 is a partial plan view showing a facing section and a non-facing section in the semiconductor module in the third embodiment.
Figure 16:
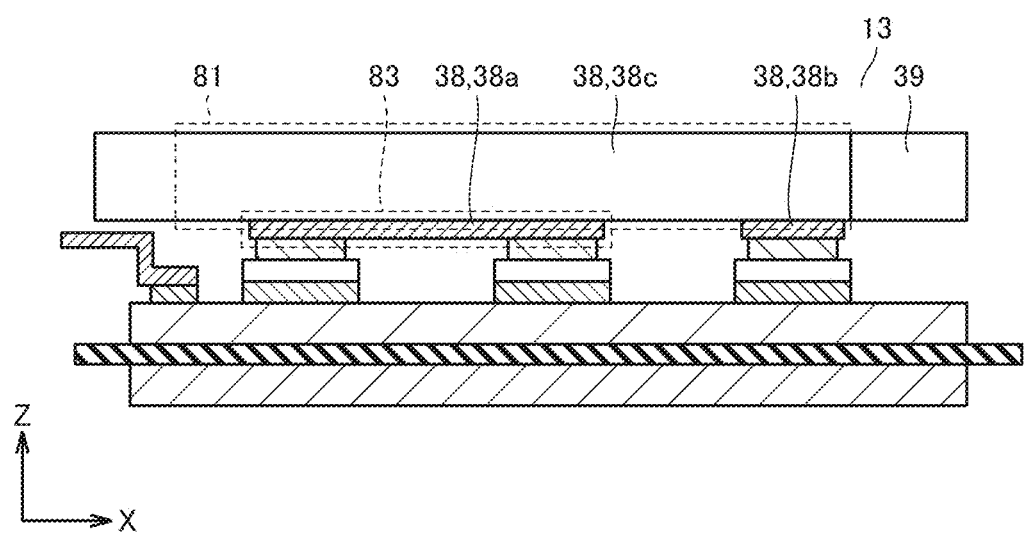
FIG. 16 is a partial cross-sectional view showing the facing section and the non-facing section of the semiconductor module taken along a cross-sectional line XVI-XVI shown in FIG. 15, in the third embodiment.

As shown in FIGS. 15 and 16, facing section 81 is provided as a portion in which third part 38c and lead frame 39 face each other. Non-facing section 83 is provided as a portion in which first part 38a and lead frame 39 are disposed to intersect with each other.

Also for the above-mentioned semiconductor module 1, the voltages on the respective source sides of semiconductor chips 17, 19, and 21 can be obtained to derive the relational expression corresponding to the equation (6) and the relational expression corresponding to the equation (9), in the same way as in semiconductor module 1 described in the first embodiment. By setting facing section 81 and non-facing section 83 based on these relational expressions, the currents flowing through semiconductor chips 17, 19, and 21 can be equalized.

Furthermore, lead frames 38 and 39 may be differently disposed to cause a different surface of third part 38c of lead frame 38 to face a different surface of lead frame 39, and also, the shape of first part 38a of lead frame 38 may be changed, thereby providing advantages of not only easy adjustment of the self-inductance for each of semiconductor chips 17, 19 and 21, but also easy application to the upper arm module.

Also, semiconductor module 1 has been described above with regard to the case where third part 38c of lead frame 38 is joined to lead frame 39 with joining material 69, but third part 38c of lead frame 38 may be joined to lead frame 39 with welding. Alternatively, an integrated lead frame (a bus bar) may also be used.

Furthermore, semiconductor module 1 (lower arm module 13) has been described above with reference to an example in which semiconductor chips 17, 19, and 21 are disposed in one row in one direction (in the X-axis direction), but semiconductor chips may be arranged not only in one row but also in multiple rows as long as three or more semiconductor chips are disposed in one direction.

Furthermore, in the same manner as described in the first embodiment, the above-mentioned semiconductor module 1 is more effective when a semiconductor chip to which a wide band gap semiconductor is applied is mounted thereon.

Each of the embodiments has been described with regard to substrate 41 having insulator 43 and conductors 45, 47 as an example of a base member. The base member is not limited to such substrate 41 but may be an insulating sheet, an electrically conductive plate or the like, for example, as long as the base member includes at least one of a conductor and an insulator.

Fourth Embodiment

In the following, a power conversion device to which semiconductor module 1 according to any one of the above-mentioned first to third embodiments is applied will be described. Although the present invention is not limited to a specific power conversion device, the following is an illustrative explanation about the fourth embodiment in the case where the present invention is applied to a three-phase inverter.

Figure 17:
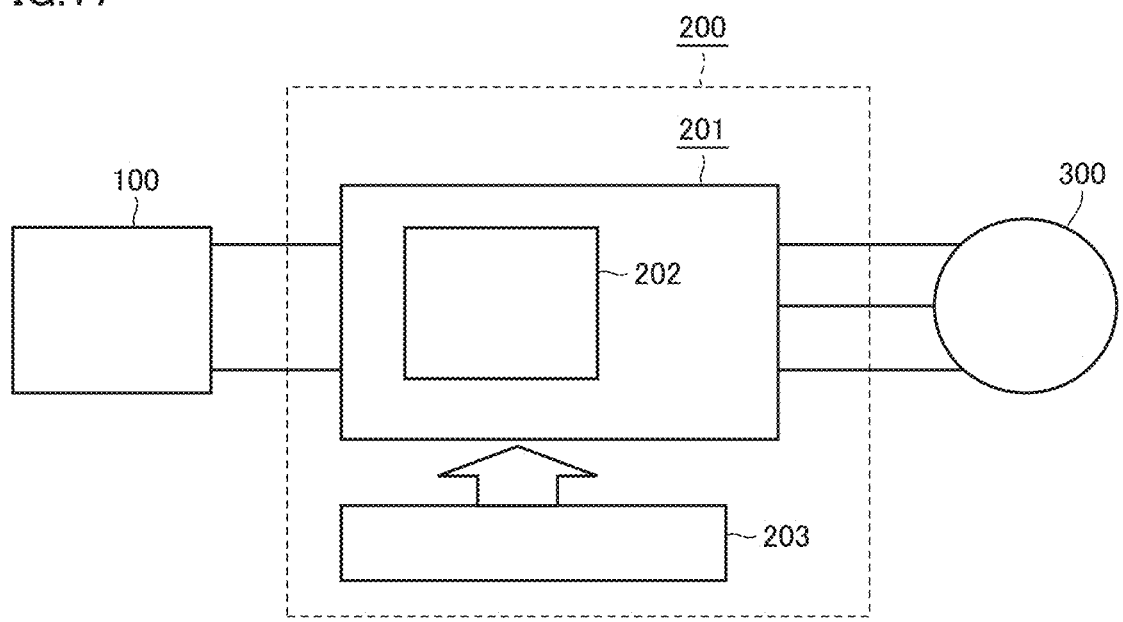
FIG. 17 is a block diagram of a power conversion device to which a semiconductor module is applied, according to the fourth embodiment of the present invention.

FIG. 17 is a block diagram showing a configuration of a power conversion system to which a power conversion device according to the present embodiment is applied. The power conversion system shown in FIG. 17 is formed of a power supply 100, a power conversion device 200, and a load 300. Power supply 100 is a direct-current (DC) power supply and supplies DC power to power conversion device 200. Power supply 100 can be formed of each of various components and may be formed of a DC system, a solar cell, or a storage battery, for example. Also, power supply 100 may be formed of a rectifier circuit connected to an alternating-current (AC) system or formed of an AC/DC converter. Power supply 100 may also be formed of a DC/DC converter that converts DC power output from the DC system into prescribed electric power.

Power conversion device 200 is a three-phase inverter connected between power supply 100 and load 300. Power conversion device 200 converts the DC power supplied from power supply 100 into AC power, and then supplies the converted AC power to load 300. As shown in FIG. 17, power conversion device 200 includes: a main conversion circuit 201 that converts DC power into AC power and outputs the converted AC power; and a control circuit 203 that outputs a control signal for controlling main conversion circuit 201 to main conversion circuit 201.

Load 300 is a three-phase electric motor that is driven with AC power supplied from power conversion device 200. Load 300 is not limited to a specific application, but is an electric motor mounted in each of various electric devices, and used as an electric motor for a hybrid vehicle, an electric vehicle, a railroad vehicle, an elevator, or an air conditioner, for example.

The details of power conversion device 200 will be hereinafter described. Main conversion circuit 201 includes a switching element and a freewheeling diode (each of which is not shown). As the switching element is switched, the DC power supplied from power supply 100 is converted into AC power and then supplied to load 300. While the specific circuit configuration of main conversion circuit 201 may be of various types, main conversion circuit 201 according to the present embodiment is a three-phase full bridge circuit configured in two levels, and may be formed of six switching elements and six freewheeling diodes that are connected in anti-parallel with the respective six switching elements, as required.

In at least any one of the switching elements and the freewheeling diodes in main conversion circuit 201, semiconductor module 1 according to any one of the above-mentioned first to third embodiments is configured as a semiconductor module 202. Six switching elements are configured such that each two switching elements are connected in series to form an upper arm and a lower arm. Each of the pairs of upper and lower arms forms a corresponding phase (a U-phase, a V-phase, and a W-phase) of a full bridge circuit. The output terminals of the upper and lower arms, that is, three output terminals of main conversion circuit 201, are connected to load 300.

Furthermore, main conversion circuit 201 includes a drive circuit (not shown) that drives each switching element. The drive circuit may be incorporated in semiconductor module 202 or may be provided separately from semiconductor module 202. The drive circuit generates a drive signal for driving each switching element in main conversion circuit 201, and supplies the generated drive signal to a control electrode of each switching element in main conversion circuit 201. Specifically, according to the control signal from control circuit 203 described later, the drive signal for bringing each switching element into an ON state and the drive signal for bringing each switching element into an OFF state are output to the control electrode of each switching element. When the switching element is maintained in an ON state, the drive signal is a voltage signal (an ON signal) equal to or greater than a threshold voltage of the switching element. When the switching element is maintained in an OFF state, the drive signal is a voltage signal (an OFF signal) equal to or less than the threshold voltage of the switching element.

Control circuit 203 controls each switching element in main conversion circuit 201 so as to supply desired electric power to load 300. Specifically, the time (ON time) at which each switching element in main conversion circuit 201 is to be brought into an ON state is calculated based on the electric power to be supplied to load 300. For example, main conversion circuit 201 can be controlled by pulse width modulation (PWM) control for modulating the ON time of each switching element according to the voltage to be output. Then, a control command (control signal) is output to the drive circuit included in main conversion circuit 201 such that an ON signal is output to the switching element that is to be brought into an ON state at each point of time and such that an OFF signal is output to the switching element that is to be brought into an OFF state at each point of time. According to this control signal, the drive circuit outputs an ON signal or an OFF signal as a drive signal to the control electrode of each switching element.

In the power conversion device according to the present embodiment, semiconductor module 1 according to any one of the first to third embodiments is applied as semiconductor module 202 to at least any one of the switching elements and the freewheeling diodes in main conversion circuit 201, thereby allowing improvement in the reliability of the power conversion device.

The present embodiment has been described with regard to the example in which the present invention is applied to a three-phase inverter configured in two levels, but the present invention is not limited thereto and can be applied to various types of power conversion devices. In the present embodiment, the power conversion device is configured in two levels, but the power conversion device may be configured in three levels or in multiple levels. Also, in the case where electric power is supplied to a single-phase load, the present invention may be applied to a single-phase inverter. In the case where electric power is supplied to a DC load or the like, the present invention may also be applicable to a DC/DC converter or an AC/DC converter.

Furthermore, the power conversion device to which the present invention is applied is not limited to the case where the above-mentioned load is an electric motor, but may be for example used as a power supply device for an electrical discharge machine, a laser beam machine, an induction heating cooking machine, or a contactless power feeding system, and furthermore, may also be used as a power conditioner for a solar power generation system, a power storage system or the like.

The semiconductor module described in each of the embodiments can be variously combined with one another as required.

The embodiments disclosed herein are merely by way of example and not limited thereto. The scope of the present invention is defined by the terms of the claims, rather than the description above, and is intended to include any modifications within the meaning and scope equivalent to the terms of the claims.

INDUSTRIAL APPLICABILITY

The present invention is effectively utilized for a semiconductor module having a direct lead bonding structure.

REFERENCE SIGNS LIST 1 semiconductor module, 3 upper arm module, 5 upper arm element, 7, 9, 11, 17, 19, 21 semiconductor chip, 13 lower arm module, 15 lower arm element, 31, 32, 33, 34, 35, 36, 37, 38, 39 lead frame, 41 substrate, 43 insulator, 45, 47 conductor, 61, 62, 63, 64, 65, 66, 67, 68, 69 joining material, 71 sealing material, 73 heat sink, 81 facing section, 83 non-facing section, P, N terminal, AC external terminal, G gate electrode, S source electrode.

The invention claimed is:

1. A semiconductor module comprising:
a base member having a main surface and including at least one of a conductor and an insulator;
a plurality of semiconductor chips mounted on the main surface of the base member;
a first wiring conductor electrically connected to each of the plurality of semiconductor chips in a state where the plurality of semiconductor chips are electrically connected in parallel; and
a second wiring conductor electrically connected to the first wiring conductor, wherein
the first wiring conductor and the second wiring conductor include:
a facing section in which the first wiring conductor and the second wiring conductor are disposed to face each other, and
a non-facing section in which the first wiring conductor and the second wiring conductor are disposed not to face each other,
the facing section is located to extend over a first pair of semiconductor chips adjacent to each other among the plurality of semiconductor chips, and
in the non-facing section, the second wiring conductor is connected to a portion of the first wiring conductor, the portion being located at a midpoint between a second pair of semiconductor chips adjacent to each other among the plurality of semiconductor chips.

2. The semiconductor module according to claim 1, wherein
in the facing section and the non-facing section, an area of a portion in which the first wiring conductor and the second wiring conductor face each other is larger than an area of a portion in which the first wiring conductor and the second wiring conductor do not face each other.

3. The semiconductor module according to claim 1, wherein
the facing section is located on a side opposite to the base member with respect to the plurality of semiconductor chips.

4. The semiconductor module according to claim 1, wherein
the plurality of semiconductor chips are disposed on the main surface of the base member to extend in one direction, and
in a plan view of the main surface, the first wiring conductor and the second wiring conductor are disposed to extend in the one direction.

5. The semiconductor module according to claim 1, wherein
in a plan view of the main surface of the base member, the facing section and the non-facing section are disposed to extend in one direction.

6. The semiconductor module according to claim 1, wherein
an insulating material fills a space between the first wiring conductor and the second wiring conductor.

7. The semiconductor module according to claim 1, wherein
the plurality of semiconductor chips include a wide band gap semiconductor.

8. A power conversion device comprising:
a main conversion circuit to convert received electric power and output converted electric power, wherein the main conversion circuit includes the semiconductor module according to claim 1; and
a control circuit to output a control signal to control the main conversion circuit to the main conversion circuit.

9. A semiconductor module comprising:
a base member having a main surface and including at least one of a conductor and an insulator;
a plurality of semiconductor chips mounted on the main surface of the base member;
a first wiring conductor electrically connected to each of the plurality of semiconductor chips in a state where the plurality of semiconductor chips are electrically connected in parallel; and
a second wiring conductor electrically connected to the first wiring conductor, wherein
the first wiring conductor and the second wiring conductor include:
a facing section in which the first wiring conductor and the second wiring conductor are disposed to face each other, and
a non-facing section in which the first wiring conductor and the second wiring conductor are disposed not to face each other,
the first wiring conductor includes:
a first part of the first wiring conductor, the first part being located on a first flat surface, and
a second part of the first wiring conductor, the second part being located on a second flat surface that intersects with the first flat surface,
the second wiring conductor is located on a third flat surface that faces the second flat surface,
in the facing section, the second part of the first wiring conductor and the second wiring conductor face each other, and
in the non-facing section, the first part of the first wiring conductor and the second wiring conductor are disposed to intersect with each other.

10. The semiconductor module according to claim 9, wherein
in the facing section, the second part of the first wiring conductor and the second wiring conductor are located to intersect with the main surface of the base member, and
in the non-facing section, the first part of the first wiring conductor is located in parallel with the main surface of the base member.

11. A power conversion device comprising:
a main conversion circuit to convert received electric power and output converted electric power, wherein the main conversion circuit includes the semiconductor module according to claim 9; and a control circuit to output a control signal to control the main conversion circuit to the main conversion circuit.

12. A semiconductor module comprising:
a base member having a main surface and including at least one of a conductor and an insulator;
a plurality of semiconductor chips mounted on the main surface of the base member;
a first wiring conductor electrically connected to each of the plurality of semiconductor chips in a state where the plurality of semiconductor chips are electrically connected in parallel; and
a second wiring conductor electrically connected to the first wiring conductor, wherein
the first wiring conductor and the second wiring conductor include:
a facing section in which the first wiring conductor and the second wiring conductor are disposed to face each other, and
a non-facing section in which the first wiring conductor and the second wiring conductor are disposed not to face each other,
the facing section is provided with:
a first portion in which the first wiring conductor and the second wiring conductor are separated at a first distance from each other,
a second portion in which the first wiring conductor and the second wiring conductor are separated at a second distance from each other, the second distance being different from the first distance, and
a sealing material for sealing the first wiring conductor and the second wiring conductor is introduced to fill a space between the first wiring conductor and the second wiring conductor.

13. The semiconductor module according to claim 12, wherein
in the non-facing section, the second wiring conductor is connected to a portion of the first wiring conductor, the portion being located at a midpoint between a pair of semiconductor chips adjacent to each other among the plurality of semiconductor chips.

14. A power conversion device comprising:
a main conversion circuit to convert received electric power and output converted electric power, wherein the main conversion circuit includes the semiconductor module according to claim 12; and
a control circuit to output a control signal to control the main conversion circuit to the main conversion circuit.

* * * * *